(12) United States Patent
Lee

(10) Patent No.: US 7,633,832 B2
(45) Date of Patent: Dec. 15, 2009

(54) CIRCUIT FOR OUTPUTTING DATA OF SEMICONDUCTOR MEMORY APPARATUS

(75) Inventor: Kyong-Ha Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 173 days.

(21) Appl. No.: 11/826,923

(22) Filed: Jul. 19, 2007

(65) Prior Publication Data
US 2008/0151680 A1    Jun. 26, 2008

(30) Foreign Application Priority Data
Dec. 22, 2006  (KR) ............... 10-2006-0132542

(51) Int. Cl.
*G11C 8/00* (2006.01)
(52) U.S. Cl. ............... 365/233.1; 365/194; 365/233.11
(58) Field of Classification Search ............. 365/233.1, 365/233.11, 191, 194
See application file for complete search history.

(56) References Cited

U.S. PATENT DOCUMENTS

| 5,663,687 | A | * | 9/1997 | Kozu ............................. 331/14 |
| 5,708,611 | A | * | 1/1998 | Iwamoto et al. ............. 365/191 |
| 5,786,717 | A | * | 7/1998 | Yu ............................... 327/143 |
| 6,313,676 | B1 | * | 11/2001 | Abe et al. ..................... 327/158 |
| 6,385,126 | B2 | * | 5/2002 | Jung et al. ............. 365/233.11 |
| 6,396,324 | B1 | * | 5/2002 | Hsu et al. ..................... 327/298 |
| 6,437,619 | B2 | * | 8/2002 | Okuda et al. ................. 327/158 |
| 6,552,587 | B2 | * | 4/2003 | Kim et al. ..................... 327/158 |
| 6,573,771 | B2 | | 6/2003 | Lee et al. |
| 7,240,269 | B2 | * | 7/2007 | Ochi ............................ 714/744 |
| 7,256,761 | B2 | * | 8/2007 | Huang et al. ................. 345/100 |
| 2008/0136477 | A1 | * | 6/2008 | Yon ............................ 327/158 |

FOREIGN PATENT DOCUMENTS

| JP | 04-274084 | 9/1992 |
| JP | 2000-200482 | 7/2000 |
| JP | 2004220602 | 8/2004 |
| JP | 2005316772 | 11/2005 |
| JP | 2006060842 | 3/2006 |
| KR | 1019960011208 | 8/1996 |
| KR | 1020030087743 | 11/2003 |

* cited by examiner

*Primary Examiner*—Tuan T Nguyen
*Assistant Examiner*—Hien N Nguyen
(74) *Attorney, Agent, or Firm*—Venable LLP; Jeffri A. Kaminski

(57) ABSTRACT

A circuit for outputting data of a semiconductor memory apparatus is provided. A circuit for outputting data of a semiconductor memory apparatus according to an embodiment of the present invention includes a data clock generating unit that generates a data clock, a delayed clock generating unit that receives the data clock and outputs a delayed clock according to a change in an external voltage level, and a clock synchronizing unit that outputs data synchronized with the delayed clock as output data.

21 Claims, 5 Drawing Sheets

CIRCUIT FOR OUTPUTTING DATA OF SEMICONDUCTOR MEMORY APPARATUS

CROSS-REFERENCE TO RELATED PATENT APPLICATION

This application claims the benefit of Korean Patent Application No. 10-2006-0132542, filed on Dec. 22, 2006, in the Korean Intellectual Property Office, the disclosure of which is incorporated herein in its entirety by reference.

BACKGROUND OF THE INVENTION

1. Technical Field

The present invention relates to a semiconductor memory apparatus, and more particularly, to a circuit for outputting data of a semiconductor memory apparatus that does not use a delay locked loop (DLL) circuit.

2. Related Art

In general, semiconductor memory apparatuses output stored data in synchronization with a clock.

FIG. 1 is a block diagram illustrating a circuit for outputting data of a semiconductor memory apparatus according to the related art.

A data clock generating unit 10 generates a data clock CLK_data according to a data input/output mode that is provided by a semiconductor memory apparatus.

For example, if a semiconductor memory apparatus may be DDR (a double data rate) type device, that is a data input/output mode in which four data are input and output at one time, the data clock generating unit 10 generates a data clock CLK_data for two cycles in response to one read command. The DDR outputs data when the data clock rises and falls.

A clock synchronizing unit 20 receives the data clock CLK_data and data DATA, synchronizes the data DATA with the data clock CLK_data, and outputs the data DATA synchronized with the data clock CLK_data as output data DATA_out.

However, an output timing of the output data DATA_out becomes earlier or later than the data clock according to a change in an external voltage VDD level. When the output timing of the output data DATA_out is changed, an external system that receives the output data DATA_out of the semiconductor memory apparatus cannot recognize the output DATA_out properly. This problem becomes serious when an operating speed of the semiconductor memory apparatus that does not use the DLL circuit increases.

SUMMARY OF THE INVENTION

Embodiments of the present invention provide a circuit for outputting data of a semiconductor memory apparatus that controls an output timing of data according to a change in an external voltage level.

According to an embodiment of the present invention, a circuit for outputting data of a semiconductor memory apparatus includes a data clock generating unit that generates a data clock, a delayed clock generating unit that receives the data clock and generates a delayed clock according to a change in an external voltage level, and a clock synchronizing unit that outputs data synchronized with the delayed clock as output data.

DESCRIPTION OF EXEMPLARY EMBODIMENT

An exemplary embodiment of the present invention will now be described in detail with reference to the accompanying drawings.

Figure 1:
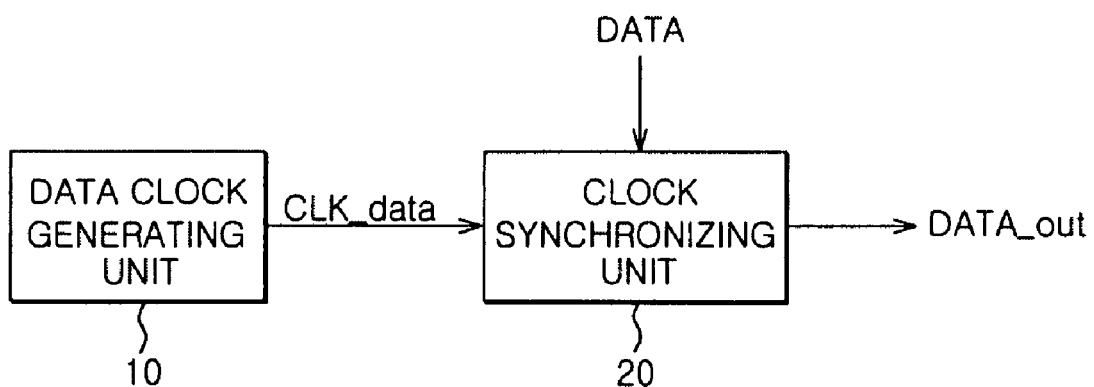
FIG. 1 is a block diagram illustrating a circuit for outputting data of a semiconductor memory apparatus according to the related art.
Figure 2:
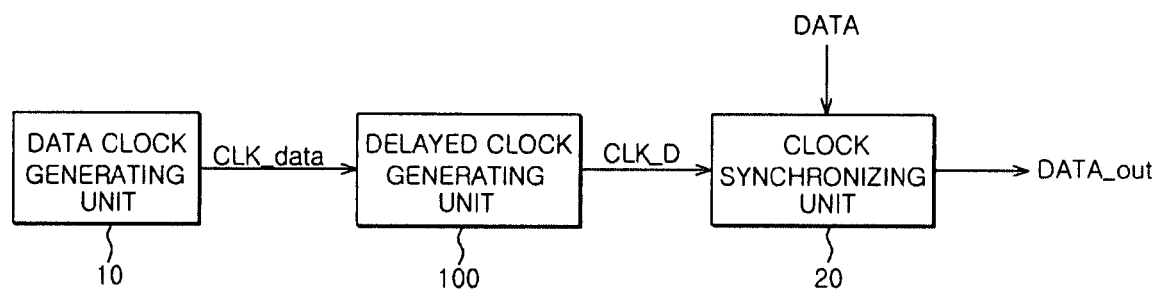
FIG. 2 is a block diagram illustrating a circuit for outputting data of a semiconductor memory apparatus according to an embodiment of the present invention.

Referring to FIG. 2, a circuit for outputting data of a semiconductor memory apparatus according to an embodiment of the present invention includes a data clock generating unit 10, a delayed clock generating unit 100, and a clock synchronizing unit 20.

The data clock generating unit 10 generates a data clock CLK_data according to a data input/output mode of the semiconductor memory apparatus. For example, when the semiconductor memory apparatus is a double data rate (DDR) type device, which allows four data to be input and output at one time, the data clock generating unit 10 generates a data clock CLK_data for two cycles in response to one read command. In the DDR type device, the data is output at rising and falling timings of the data clock CLK_data.

The delayed clock generating unit 100 receives the data clock CLK_data, determines an output timing of the data clock CLK_data according to a level of an external voltage VDD, and outputs the data clock CLK_data, whose output timing is determined, as a delayed clock CLK_D.

The clock synchronizing unit 20 receives the delayed clock CLK_D and the data DATA, synchronizes the data DATA with the delayed clock CLK_D, and outputs the data DATA synchronized with the delayed clock CLK_D as output data DATA_out.

Figure 3:
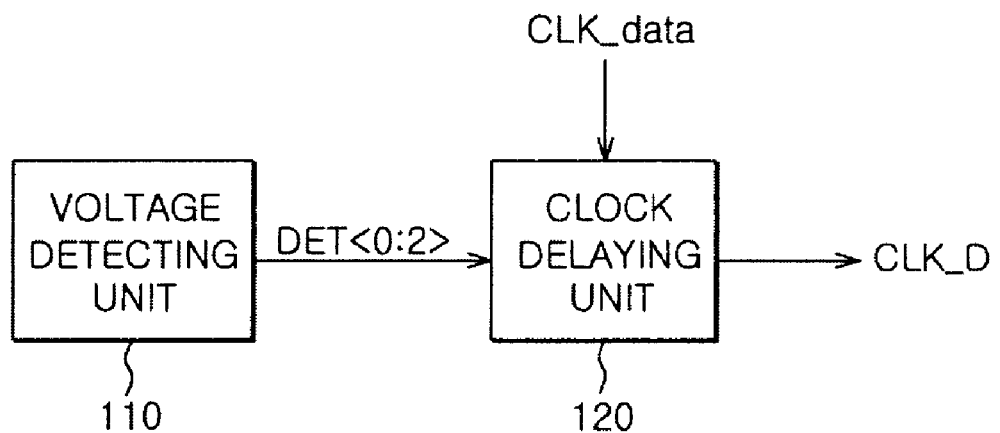
FIG. 3 is a block diagram illustrating a delayed clock generating unit shown in FIG. 2.

As shown in FIG. 3, the delayed clock generating unit 100 includes a voltage detecting unit 110 and a clock delaying unit 120.

The voltage detecting unit 110 detects the level of the external voltage VDD and generates first to third detection signals DET<0:2> according to the level of the external voltage VDD.

The clock delaying unit 120 determines an output timing of the data clock CLK_data, that is, a delay value, in response to the first to third detection signals DET<0:2>, and outputs the data clock CLK_data, whose outputting timing is determined, as the delayed clock CLK_D.

At this time, compared to the other detection signals DET1 and DET2, the first detection signal DET0 is enabled at a high level when the external voltage VDD is at the lowest level. Further, compared to the other detection signals DET0 and DET1, the third detection signal DET2 is enabled at a high level when the external voltage VDD is at the highest level. Therefore, when the first detection signal DET0 is only enabled at a high level, the clock delaying unit 120 delays the data clock CLK_data by the shortest delay time of the clock delaying unit 120 and outputs the delayed data clock CLK_data as the delayed clock CLK_D. When the third detection signal DET2 is enabled at a high level, the clock delaying unit 120 delays the data clock CLK_data by the longest delay time of the clock delaying unit 120, and outputs the delayed data clock CLK_data as the delayed clock CLK_D.

Figure 4:
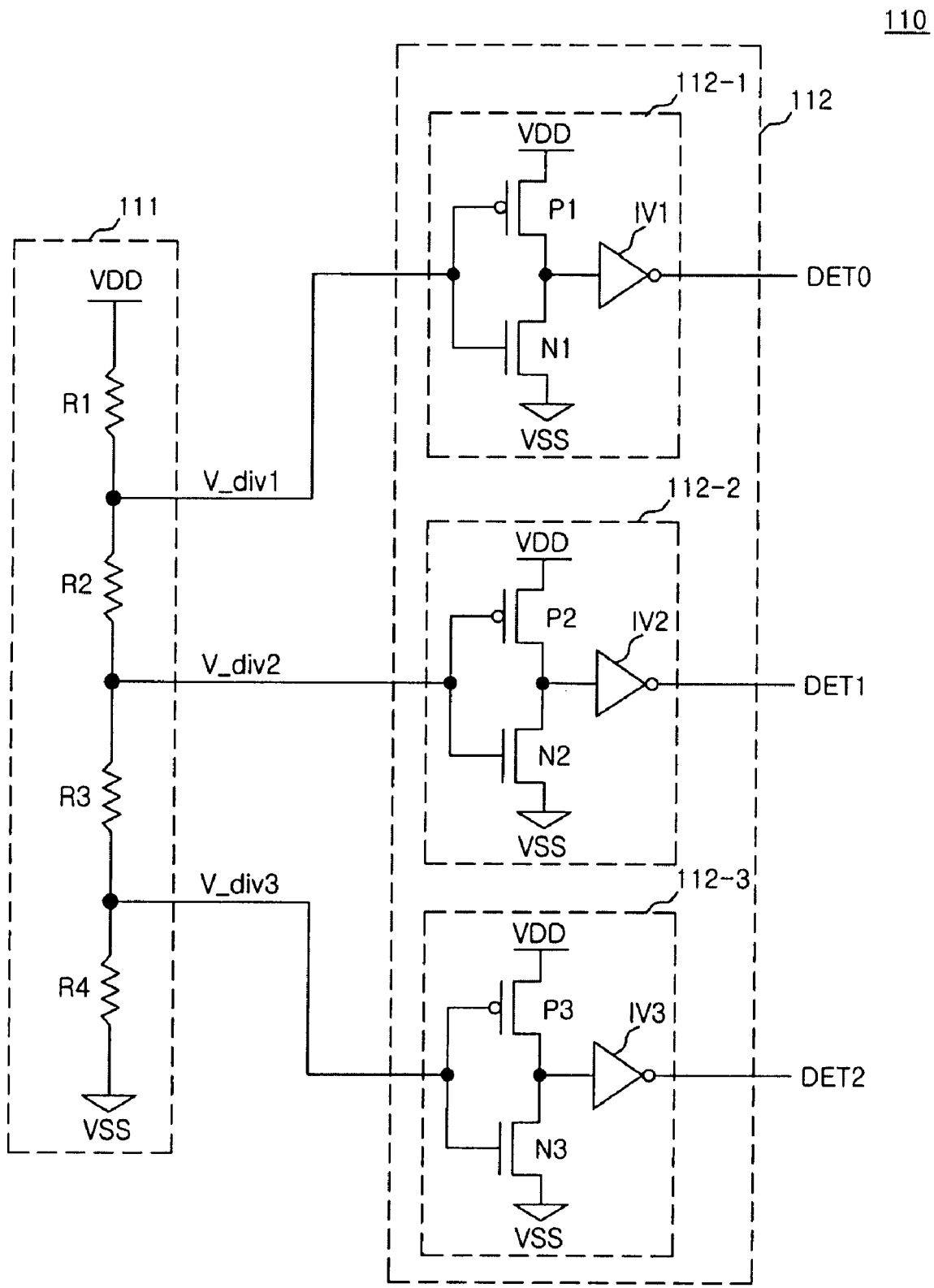
FIG. 4 is a circuit diagram illustrating a voltage detecting unit shown in FIG. 3.

As shown in FIG. 4, the voltage detecting unit 110 includes a voltage dividing unit 111 and a detection signal generating unit 112.

The voltage dividing unit 111 divides the external voltage VDD and generates first to third divided voltages V_div<1:3>.

The voltage dividing unit 111 includes first to fourth resistive elements R1 to R4 that are connected in series between the external voltage terminal VDD and a ground terminal VSS. At this time, the first divided voltage V_div1 is output from a node at which the first resistive element R1 and the second resistive element R2 are connected to each other, the second divided voltage V_div2 is output from a node at which the second resistive element R2 and the third resistive element R3 are connected to each other, and the third divided voltage V_div3 is output at a node at which the third resistive element R3 and the fourth resistive element R4 are connected to each other.

The detection signal generating unit 112 generates first to third detection signals DET<0:2> in response to levels of the first to third divided voltages V_div<1:3>, respectively.

The detection signal generating unit 112 includes a first signal generating unit 112-1, a second signal generating unit 112-2, and a third signal generating unit 112-3.

The first signal generating unit 112-1 generates the first detection signal DET0 in response to the level of the first divided voltage V_div1.

Since the first signal generating unit 112-1 is supplied with the first divided voltage V_div1, the first signal generating unit 112-1 enables the first detection signal DET0 at a high level before the other signal generating units 112-2 and 112-3 are enabled. That is, compared to the other detection signals DET1 and DET2, the first detection signal DET0 is enabled at the high level by the external voltage VDD having the lowest level.

The first signal generating unit 112-1 includes a first transistor P1, a second transistor N1, and a first inverter IV1. The first transistor P1 includes a gate to which the first divided voltage V_div1 is applied and a source to which the external voltage VDD is applied. The second transistor N1 includes a gate to which the first divided voltage V_div1 is applied, a source connected to the ground terminal VSS, and a drain connected to the drain of the first transistor P1. The first inverter IV1 includes an input terminal connected to a node at which the first transistor P1 and the second transistor N1 are connected to each other, and an output terminal from which the first detection signal DET0 is output.

The second signal generating unit 112-2 generates the second detection signal DET1 in response to a level of the second divided voltage V_div2.

The second signal generating unit 112-2 includes a third transistor P2, a fourth transistor N2, and a second inverter IV2. The third transistor P2 includes a gate to which the second divided voltage V_div2 is applied and a source to which the external voltage VDD is applied. The fourth transistor N2 includes a gate to which the second divided voltage V_div2 is applied, a source connected to the ground terminal VSS, and a drain connected to the drain of the third transistor P2. The second inverter IV2 includes an input terminal connected to a node at which the third transistor P2 and the fourth transistor N2 are connected to each other, and an output terminal from which the second detection signal DET1 is output.

The third signal generating unit 112-3 generates the third detection signal DET2 in response to a level of the third divided voltage V_div3. Since the third signal generating unit 112-3 is supplied with the third divided voltage V_div3, the third signal generating unit 112-3 enables the third detection signal DET2 at a high level after the other signal generating units 112-1 and 112-2. That is, compared to the other detection signals DET1 and DET2, the third detection signal DET2 is enabled at the high level by the external voltage VDD having the highest level.

The third signal generating unit 112-3 includes a fifth transistor P3, a sixth transistor N3, and a third inverter IV3. The fifth transistor P3 includes a gate to which the third divided voltage V_div3 is applied and a source to which the external voltage VDD is applied. The sixth transistor N3 includes a gate to which the third divided voltage V_div3 is applied, a source connected to the ground terminal VSS, and a drain connected to the drain of the fifth transistor P3. The third inverter IV3 includes an input terminal connected to a node at which the fifth transistor P3 and the sixth transistor N3 are connected to each other, and an output terminal from which the third detection signal DET2 is output.

Figure 5:
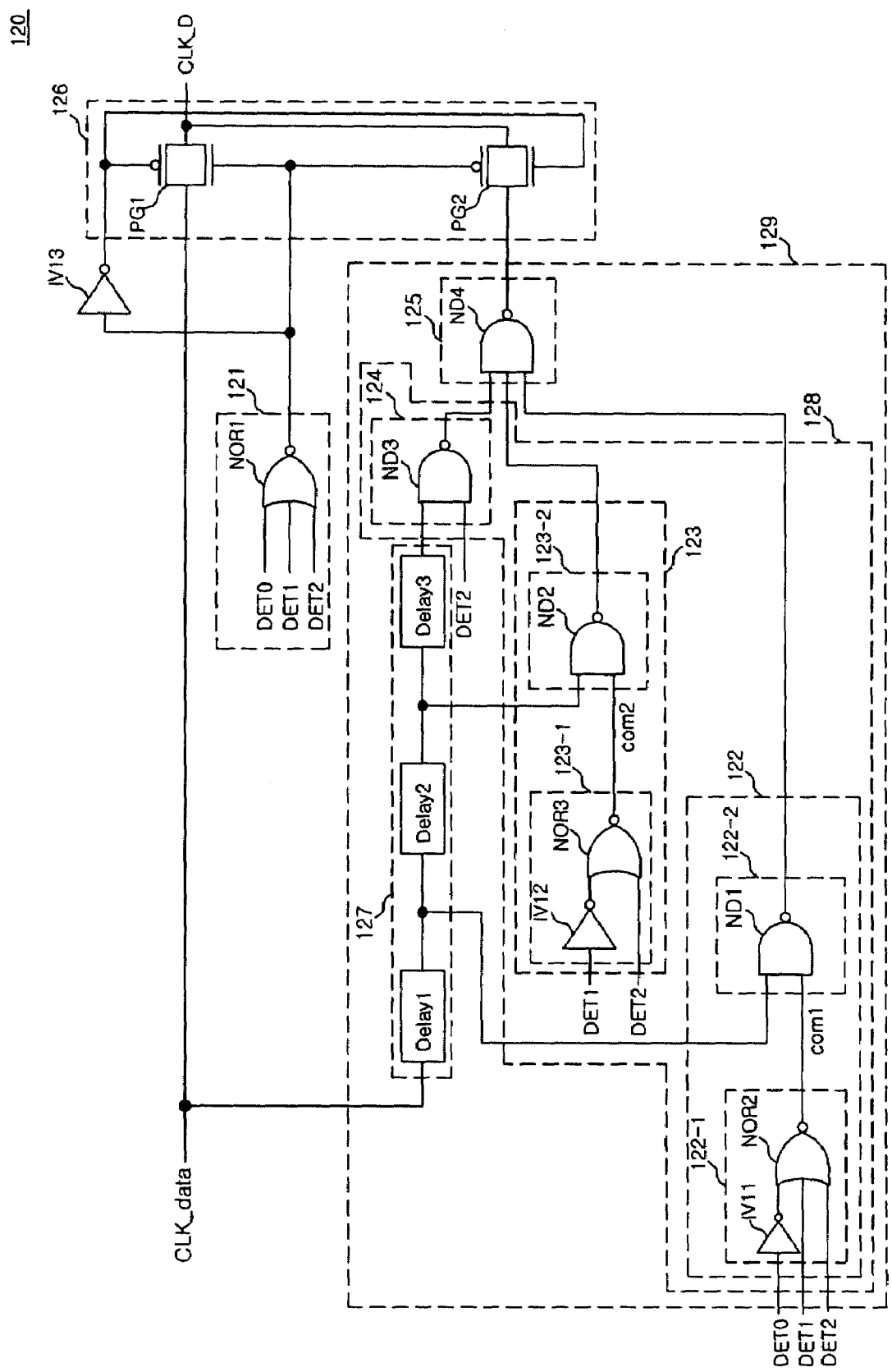
FIG. 5 is a circuit diagram illustrating a clock delaying unit shown in FIG. 3.

As shown in FIG. 5, the clock delaying unit 120 includes a selecting unit 121, a delayed clock generating unit 129, and an output selecting unit 126.

The selecting unit 121 outputs the data clock CLK_data as the delayed clock CLK_D in response to the first to third detection signals DET<0:2>.

The selecting unit 121 includes a first NOR gate NOR1 that receives the first to third detection signals DET<0:2>. Therefore, when all of the first to third detection signals DET<0:2> are at a low level, the selecting unit 121 outputs a value at a high level, such that the data clock CLK_data itself can be output as the delayed clock CLK_D.

The delayed clock generating unit 129 determines an output timing of the data clock CLK_data, that is, a delay value, in response to the first to third detection signals DET<0:2>, and outputs the data clock CLK_data, whose output timing is determined, as the delayed clock CLK_D.

The delayed clock generating unit 129 includes a delay chain 127, a delay determining unit 128, and a signal combining unit 125.

The delay chain 127 includes first to third delay units Delay1, Delay2, and Delay3 that are connected in series to each other. The first delay unit Delay1 receives the data clock CLK_data.

The delay determining unit 128 selectively outputs output signals of the first to third delay units Delay1, Delay2, and Delay3 in response to the first to third detection signals DET<0:2>, respectively.

The delay determining unit 128 includes first to third output instructing units 122, 123, and 124.

The first output instructing unit 122 inverts and outputs the output signal of the first delay unit Delay1 in response to the first to third detection signals DET<0:2>.

The first output instructing unit 122 includes a first detection signal combining unit 122-1 and a first output determining unit 122-2.

The first detection signal combining unit 122-1 generates a first combination signal com1 in response to the first to third detection signals DET<0:2>.

The first detection signal combining unit 122-1 includes a fifth inverter IV11 and a second NOR gate NOR2. The fifth inverter IV11 receives the first detection signal DET0. The second NOR gate NOR2 receives an output signal of the fifth inverter IV11, the second detection signal DET1, and the third detection signal DET2, and generates the first combination signal com1. At this time, when the first detection signal DET0 is only at a high level, and the other detection signals DET1 and DET2 are at a low level, the first combination signal com1 is enabled at a high level.

The first output determining unit 122-2 includes a first NAND gate ND1 that receives the first combination signal com1 and the output signal of the first delay unit Delay1. At this time, when the first combination signal com1 is at a high level, the first output determining unit 122-2 inverts and outputs the output signal of the first delay unit Delay1. When the first combination signal com1 is at a low level, the first output determining unit 122-2 outputs a signal at a predetermined high level.

The second output instructing unit 123 inverts the output signal of the second delay unit Delay2 in response to the second detection signal DET1 and the third detection signal DET2. When the second detection signal DET1 is at a high level, since the first detection signal DET0 is at a high level, the first detection signal is not input to the second output instructing unit 123.

The second output instructing unit 123 may include a second detection signal combining unit 123-1 and a second output determining unit 123-2.

The second detection signal combining unit 123-1 generates the second combination signal com2 in response to the second and third detection signals DET<1:2>.

The second detection signal combining unit 123-1 may includes a sixth inverter IV12 and a third NOR gate NOR3. The sixth inverter IV12 receives the second detection signal DET1. The third NOR gate NOR3 receives an output signal of the sixth inverter IV12 and the third detection signal DET2 and generates the second combination signal com2. Therefore, when the second detection signal DET1 is at a high level and the third detection signal DET2 is at a low level, the second combination signal com2 becomes a high level.

The second output determining unit 123-2 inverts the output signal of the second delay unit Delay2 when the second combination signal com2 is at a high level. The second output determining unit 123-2 outputs a signal at a predetermined high level when the second combination signal com2 is at a low level.

The second output determining unit 123-2 may include a second NAND gate ND2 that receives the second combination signal com2 and the output signal of the second delay unit Delay2.

The third output instructing unit 124 inverts and outputs the output signal of the third delay unit Delay3 in response to the third detection signal DET2. When the third detection signal DET2 is at a high level, since the other detection signals DET0 and DET1 are at a high level, the detection signals DET0 and DET1 are not input to the third output instructing unit 124.

The third output instructing unit 124 may include a third NAND gate ND3 that receives the third detection signal DET2 and the output signal of the third delay unit Delay3. When the third detection signal DET2 is at a high level, the third output instructing unit 124 inverts and outputs the output signal of the third delay unit Delay3. Meanwhile, when the third detection signal DET2 is at a low level, the third output instructing unit 124 outputs a signal at a high level regardless of the output signal of the third delay unit Delay3.

The signal combining unit 125 inverts and outputs one of the output signals of the first to third output instructing units 122, 123, and 124 as the delayed clock CLK_D.

The signal combining unit 125 includes a fourth NAND gate ND4 that receives the output signals of the first to third output instructing units 122, 123, and 124. For example, when the first output instructing unit 122 inverts the output signal of the first delay unit Delay1 and the other output instructing units 123 and 124 output the output signals at a high level, the signal combining unit 125 inverts the output signal of the first output instructing unit 122.

The output selecting unit 126 selects the data clock CLK_data or the output signal of the delayed clock generating unit 129, that is, the data clock CLK_data whose output timing is determined, according to an output signal of the selecting unit 121, and outputs the selected data clock CLK_data as the delayed clock CLK_D. At this time, the clock delaying unit 120 further includes a fourth inverter IV13 that inverts the output signal of the selecting unit 121.

The output selecting unit 126 includes a first pass gate PG1 serving as a first switching element and a second pass gate PG2 serving as a second switching element.

When the output signal of the selecting unit 121 is at a high level, that is, when all of the detection signals DET<0:2> are at a low level, the first pass gate PG1 outputs the data clock CLK_data as the delayed clock CLK_D.

When the output signal of the selecting unit 121 is at a low level, that is, when at least one of the first to third detection signals DET<0:2> is at a high level, the second pass gate PG2 outputs the output signal of the delayed clock generating unit 129 as the delayed clock CLK_D.

When all of the first to third detection signals DET<0:2> are at a low level, the circuit for outputting data according to an embodiment of the present invention outputs the data clock CLK_data itself as the delayed clock CLK_D. That is, the circuit for outputting data synchronizes the data DATA with the delayed clock CLK_D and outputs the data DATA synchronized with the delayed clock CLK_D. Further, when the external voltage VDD is at the highest level, that is, the third detection signal DET2 is at a high level, the circuit for outputting data outputs the data clock CLK_data, which is delayed by the longest delay time, as the delayed clock CLK_D. The data DATA is synchronized with the delayed clock CLK_D that is delayed by the longest delay time, and then output.

That is, the output timing of the data clock CLK_data is controlled in response to the external voltage VDD level, such that the output timing of the data DATA can be controlled.

The circuit for outputting data of the semiconductor memory apparatus according to an embodiment of the present invention controls the output timing of the data according to the change in an external voltage level, stably outputs data, and improves reliability of the semiconductor memory apparatus.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A circuit for outputting data of a semiconductor memory apparatus, the circuit comprising:
    a data clock generating unit that receives an external voltage generates a data clock;
    a delayed clock generating unit that receives the data clock, generates a plurality of detection signals according to a change in the external voltage, and generates a delayed clock-in response to the plurality of detection signals voltage level; and a clock synchronizing unit that outputs data synchronized with the delayed clock as output data.

2. The circuit of claim 1,
wherein the delayed clock generating unit includes:
a voltage detecting unit that detects the external voltage level and enables selectively the plurality of detection signals; and
a clock delaying unit that receives the plurality of detection signals, determines an output timing of the data clock, and outputs the data clock in response to the plurality of detection signals, whose output timing is determined, as the delayed clock.

3. The circuit of claim 2,
wherein the voltage detecting unit includes:
a voltage dividing unit that generates a plurality of divided voltages; and
a detection signal generating unit that generates the plurality of detection signals in response to the plurality of divided voltages, respectively.

4. The circuit of claim 3,
wherein the voltage dividing unit includes a plurality of resistive elements connected in series between an external voltage terminal and a ground terminal and that generates the plurality of divided voltages from nodes where one of the plurality of resistive elements is connected to another one of the plurality of resistive elements.

5. The circuit of claim 3,
wherein the detection signal generating unit includes a plurality of signal generating units each of which generates one of the plurality of detection signals in response to a respective one of the divided voltages among the plurality of divided voltages.

6. The circuit of claim 5,
wherein each of the signal generating units enables the detection signal when a level of the input divided voltage is higher than that of a threshold voltage of a transistor.

7. The circuit of claim 6,
wherein each of the signal generating units includes:
a first transistor that includes a drain, a gate to which the divided voltage input to the signal generating unit is applied and a source to which the external voltage is applied;
a second transistor that includes a gate to which the divided voltage input to the signal generating unit is applied, a source connected to the ground terminal, and a drain connected to the drain of the first transistor at a node; and
an inverter that includes an input terminal connected to the node at which the first transistor and the second transistor are connected to each other and an output terminal from which the detection signal is output.

8. The circuit of claim 2,
wherein the clock delaying unit includes:
a selecting unit that outputs the data clock as the delayed clock in response to the plurality of detection signals as an output signal;
a delayed clock generating unit that determines a delay value in response to the plurality of detection signals, delays the data clock according to the determined delay value, and outputs the delayed data clock as the delayed clock as an output signal; and
an output selecting unit that outputs the data clock as the delayed clock or the output signal of the delayed clock generating unit as the delayed clock in accordance with the output signal of the selecting unit.

9. The circuit of claim 8,
wherein the selecting unit is a NOR gate that receives the plurality of detection signals as input.

10. The circuit of claim 8,
wherein the delayed clock generating unit includes:
a delay chain that includes a plurality of delay units connected in series to each other and each providing an output signal, in which a first delay unit of the plurality of delay units receives the data clock;
a delay determining unit that selectively outputs one of the output signals of the plurality of delay units in response to the plurality of detection signals as an output signal; and
a signal combining unit that receives the output signal of the delay determining unit and outputs the output signal of the delay determining unit as the delayed clock.

11. The circuit of claim 10,
wherein the delay determining unit includes a plurality of output instructing units, each of which receives the output signal of one corresponding delay unit among the plurality of delay units and outputs the received output signal of the delay unit in response to a combination of the plurality of detection signals.

12. The circuit of claim 11,
wherein each of the output instructing units outputs the received output signal of the delay unit when the combination of the plurality of detection signals activates the output instructing unit, and outputs a signal at a predetermined level when the combination thereof does not activate the output instructing unit.

13. The circuit of claim 12,
wherein each of the output instructing units includes:
a detection signal combining unit that generates a combination signal in response to the combination of the plurality of detection signals; and
an output determining unit that outputs the received output signal of the delay unit or the signal at the predetermined level based on the combination signal.

14. The circuit of claim 13,
wherein the detection signal combining unit enables the combination signal when the combination of the plurality of detection signals corresponds to the detection signal combining unit and disables the combination signal when the combination thereof does not correspond to the detection signal combining unit.

15. The circuit of claim 14,
wherein the detection signal combining unit includes a NOR gate that receives the combination of the plurality of detection signals.

16. The circuit of claim 13,
wherein the output determining unit is a NAND gate that receives the output signal of the corresponding delay unit among the plurality of delay units and the combination signal.

17. The circuit of claim 10,
wherein the signal combining unit is a NAND gate that receives the output signal of the delay determining unit and the output signal of the delay unit that is selected according to the plurality of detection signals.

18. The circuit of claim 8,
wherein the output selecting unit includes:
a first switching element that outputs the data clock as the delayed clock in response to the output signal of the selecting unit; and
a second switching element that outputs the output signal of the delayed clock generating unit as the delayed clock in response to the output signal of the selecting unit.

19. A circuit for outputting data of a semiconductor memory apparatus, the circuit comprising:
- a voltage detecting unit that detects an external voltage level to enable selectively plurality of detection signals;
- a clock delaying unit that receives the plurality of detection signals and a data clock, determines delay time in response to the plurality of detection signals, delays the data clock by the determined delay time, and outputs the delayed data clock as a delayed clock; and
- a clock synchronizing unit that receives a data and the delayed clock, and synchronizes the data with the delayed clock to generate an output data.

20. The circuit of claim 19,
wherein the voltage detecting unit includes:
- a voltage dividing unit that generates a plurality of divided voltages; and
- a detection signal generating unit that generates the plurality of detection signals in response to the plurality of divided voltages, respectively.

21. The circuit of claim 19,
wherein the clock delaying unit includes:
- a selecting unit that outputs the data clock as the delayed clock in response to the plurality of detection signals as an output signal;
- a delayed clock generating unit that determines a delay value in response to the plurality of detection signals, delays the data clock according to the determined delay value, and outputs the delayed data clock as the delayed clock as an output signal; and
- an output selecting unit that outputs the data clock as the delayed clock or the output signal of the delayed clock generating unit as the delayed clock in accordance with the output signal of the selecting unit.

* * * * *